(12) United States Patent
McCollough, Jr.

(10) Patent No.: US 7,187,275 B2
(45) Date of Patent: *Mar. 6, 2007

(54) METHOD AND APPARATUS FOR A REMOTE ELECTRIC POWER LINE CONDUCTOR FAULTED CIRCUIT CURRENT, CONDUCTOR TEMPERATURE, CONDUCTOR POTENTIAL AND CONDUCTOR STRAIN MONITORING AND ALARM SYSTEM

(76) Inventor: Norman D McCollough, Jr., 182 McCoy Rd., Sharon, NH (US) 03458

( * ) Notice: Subject to any disclaimer, the term of this patent is extended or adjusted under 35 U.S.C. 154(b) by 264 days.

This patent is subject to a terminal disclaimer.

(21) Appl. No.: 10/904,052

(22) Filed: Oct. 21, 2004

(65) Prior Publication Data

US 2006/0087322 A1    Apr. 27, 2006

(51) Int. Cl.
*G08B 1/08* (2006.01)
(52) U.S. Cl. .................. 340/538; 340/517; 340/521; 340/539.16
(58) Field of Classification Search .............. None
See application file for complete search history.

(56) References Cited

U.S. PATENT DOCUMENTS

| | | | |
|---|---|---|---|
| 3,806,905 A | 4/1974 | Strenglin | 340/442 |
| 3,922,659 A | 11/1975 | Dighe | 340/652 |
| 4,158,810 A * | 6/1979 | Leskovar | 324/127 |
| 4,176,350 A | 11/1979 | Patterson | 340/652 |
| 4,268,818 A * | 5/1981 | Davis et al. | 340/870.38 |
| 4,450,431 A | 5/1984 | Hochstein | 340/442 |
| 4,616,216 A | 10/1986 | Meirow et al. | 340/652 |
| 4,635,055 A * | 1/1987 | Fernandes et al. | 340/870.17 |
| 4,758,962 A * | 7/1988 | Fernandes | 702/62 |
| 4,829,298 A * | 5/1989 | Fernandes | 340/870.27 |
| 4,918,423 A | 4/1990 | Fukuyama et al. | 340/442 |
| 5,003,426 A | 3/1991 | Yeh et al. | 361/59 |
| 5,006,846 A * | 4/1991 | Granville et al. | 340/870.28 |
| 5,010,438 A | 4/1991 | Brady | 361/56 |
| 5,045,778 A | 9/1991 | Thibodeau et al. | 324/133 |
| 5,481,259 A * | 1/1996 | Bane | 340/870.03 |
| 5,565,783 A * | 10/1996 | Lau et al. | 324/522 |
| 5,726,646 A * | 3/1998 | Bane et al. | 340/870.03 |
| 5,959,537 A | 9/1999 | Banting et al. | 340/664 |
| 7,072,163 B2 * | 7/2006 | McCollough, Jr. | 361/93.1 |

* cited by examiner

*Primary Examiner*—Daniel Wu
*Assistant Examiner*—Son Tang

(57) ABSTRACT

An electric power line characteristic monitoring method that allows automatic conductor circuit fault data logging of average nominal and maximum magnitudes of conductor current, voltage, temperature and strain. Additionally, an alarm is implemented to enunciate a faulted condition on the power line. Parametric data storage is provided for later retrieval by a remote exciter. The parametric data is retrieved from the exciter through the transmission of a specific frequency and code key that activates the exciter.

15 Claims, 3 Drawing Sheets

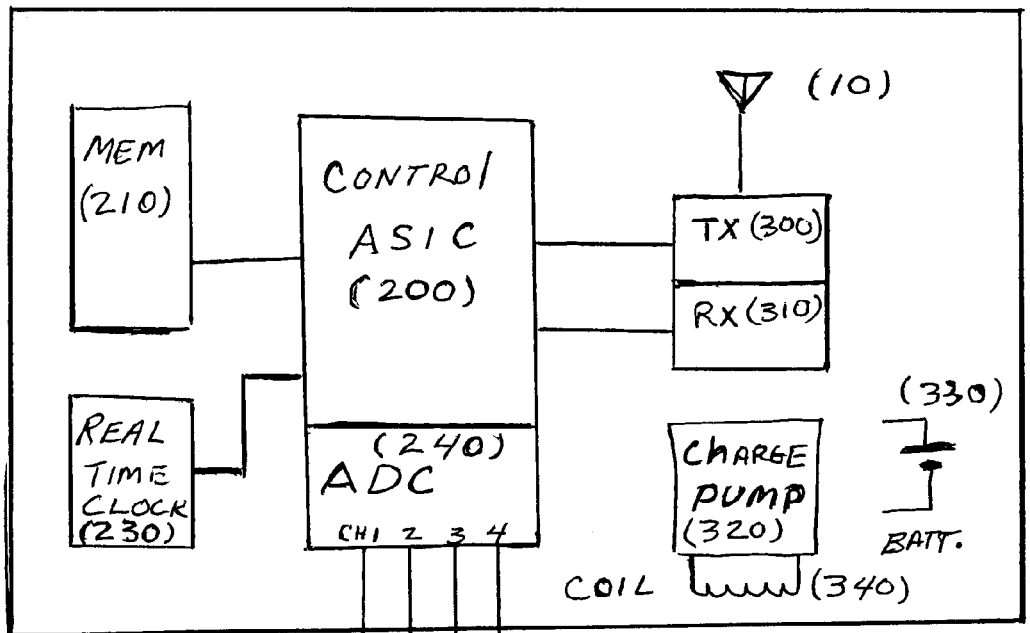
FIG 2.
FAULTED CIRCUIT MONITOR
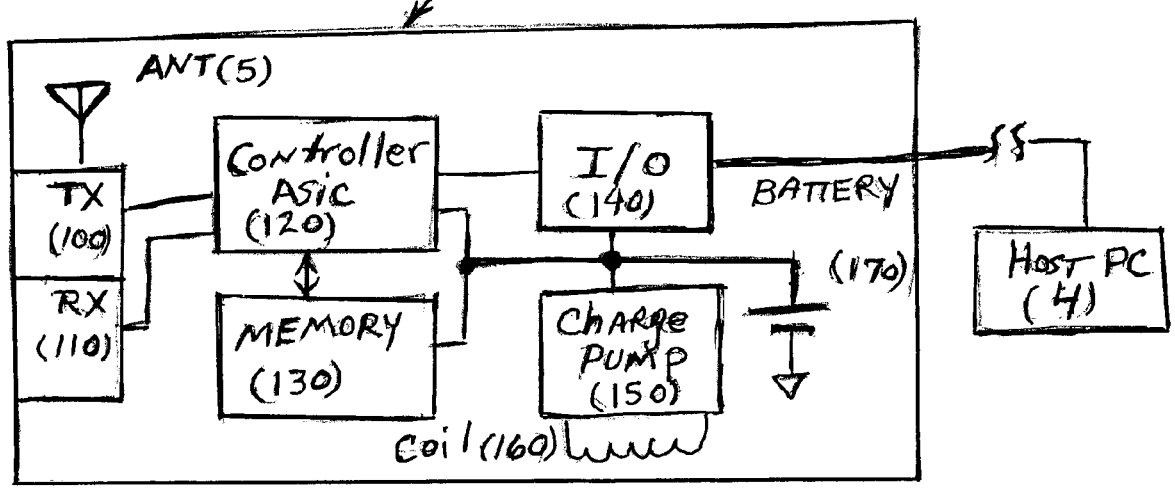
EXCITER   FIG. 3

METHOD AND APPARATUS FOR A REMOTE ELECTRIC POWER LINE CONDUCTOR FAULTED CIRCUIT CURRENT, CONDUCTOR TEMPERATURE, CONDUCTOR POTENTIAL AND CONDUCTOR STRAIN MONITORING AND ALARM SYSTEM

BACKGROUND

The present invention is generally related to a method and apparatus for monitoring and logging the characteristics of the power line conductor current flow, conductor temperature data, conductor strain data, and conductor potential data under a normal or a faulted circuit condition of the power line and providing a visual enunciation of the condition where parameters are outside programmed limits.

Systems have been developed to indicate a power line conductor under a faulted circuit condition, and to report the characteristic to a receiver using radio transmissions.

One problem with such systems is that they can only indicate if a specific maximum single level "trip" current was exceeded. They cannot report any specific faulted circuit current levels or preset steps. Present devices cannot record and store the date and time information of the fault within the faulted circuit indicator.

Present systems have no provision to collect conductor temperature, conductor strain, or conductor line potential. Present systems cannot be field programmed for a specific inrush delay curve in the field or remotely from an exciter.

A further limitation is the time the present systems report the data. In a typical application, the data are transmitted for 4, 8, or 24 hours then they automatically reset and information is lost. The reset limitation is also due to limited battery life in the device and a requirement that low maintenance of the device on the power line is required typically 5 years or longer.

SUMMARY

The present invention is directed to an improved remote faulted circuit monitoring system that will hold in memory the magnitude of the current that flowed during a normal and faulted condition of the power line conductor, conductor temperature data, conductor potential data, and strain data on the conductor due to wind or ice loading. Further a date and time of the event occurrences are stored in a memory component. The data are held indefinitely. No battery is present in the faulted circuit monitoring device, although it is possible to use a battery in the application. Power is derived by use of an inductive pickup coil and charge pump or by use of a rectifier in the rf detector circuit to rectify an rf signal to a DC voltage.

By way of introduction only, in one embodiment, the faulted circuit monitor has an internal ADC that periodically digitizes the maximum levels of current as induced from the power line conductor under normal or faulted conditions, strain, potential, and temperature. A programmable delay time of the ADC is further included to allow for an "inrush restraint" to report only the true magnitude of the current level flowing in the power line conductor after power restoration.

The control ASIC in the faulted circuit monitor stores the digitized data in a memory component for later retrieval. Date and time data are stored and associated with the event occurrence and digitized data.

Programmable preset alarm levels in the faulted circuit monitor system allow circuitry to control a visual LED indication of current exceeding a preset level to an observer on the ground.

The faulted circuit monitor is activated by detection of the specific frequency and key code from the nearby exciter. In response to the specific frequency and key code, the faulted circuit monitor transmits normal and fault data in the form of a current level magnitude corresponding to amperes of current, temperature, strain and potential to the exciter.

The exciter stores received data from the faulted circuit monitor and manually entered data associated with a particular location of the faulted circuit monitor.

The foregoing discussion of the preferred embodiments has been provided only by way of introduction. Nothing in this section should be taken as a limitation on the following claims, which define the scope of the invention.

BRIEF DESCRIPTION OF THE DRAWINGS

FIG. 2. is the simplified block diagram of the faulted circuit monitor.

FIG. 3. is the simplified block diagram of the exciter unit.

DETAILED DESCRIPTION OF THE PRESENTLY PREFERRED EMBODIMENTS

Figure 1:
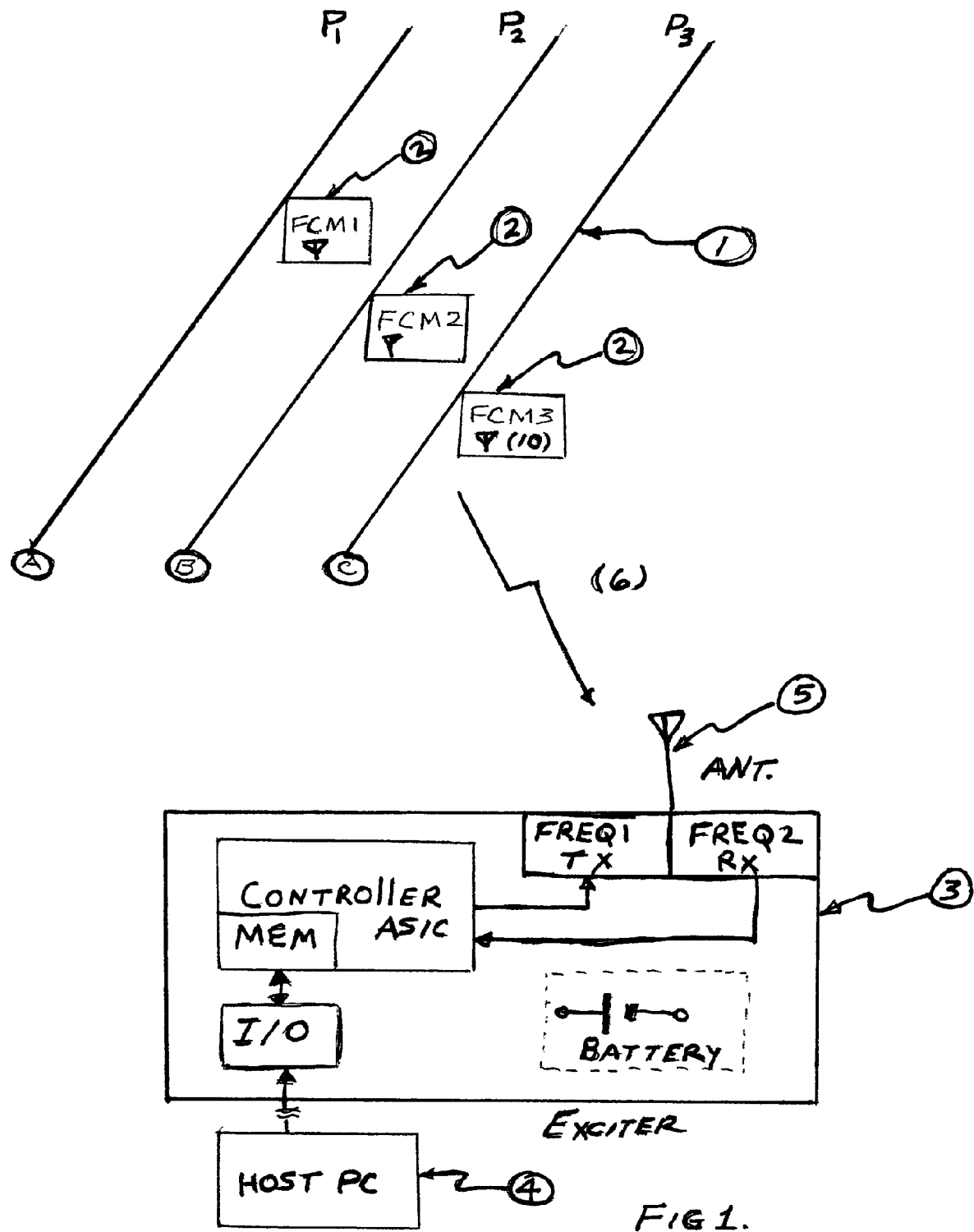
FIG. 1. is the block diagram of the remote faulted circuit monitoring system.

Referring now to the drawings, FIG. 1. illustrates three faulted circuit monitor (FCM) 2 devices located on the individual phase conductors, P1, P2, and P3 1 of the electric utility power lines. Radio frequency transmissions 6 are sent from the antenna 5 of the exciter 3 to the faulted circuit monitors 2. Contained in these transmissions is the code key as identification for the individual faulted circuit monitor. Anti-collision protocols are implemented in the faulted circuit monitors 2 such that only the faulted circuit monitor having a matching code key will respond to the exciter 3 signal. In this example, the diagram further shows an exciter 3 unit collecting data from the individual phase conductor faulted circuit monitors 2 FCM(1), FCM(2), and FCM(3). The exciter 3 further includes an I/O 140 section for transferring the stored data to a host portable computer 4. The exciter 3 is configured to be portable and operate proximate to the faulted circuit monitors 2.

Now referring to FIG. 2, the faulted circuit monitors themselves are shown. Control ASIC 200 performs the function of controlling the analog to digital converter ADC 240, receiver RX 310, transmitter TX 300, light emitting diode LED 250 and real time clock 230. Specifically, Control ASIC 240 periodically polls receiver RX 310 for exciter 3 commands, triggers ADC 240 to convert analog transducer inputs of current 260, temperature 270, strain 280, and potential 290 into digital representations of same, stores digital data in memory 210, compares newly acquired data with previously acquired data and alarm set points in memory 210, and in response to levels exceeding set point levels, reading the real time clock 230 and storing a date and time of the alarm condition, and provide a signal to illuminate LED 250 as an alarm enunciation.

Once the faulted circuit monitor 2 receives radiated rf energy at 10 from the exciter 3 for some small interval of time, the faulted circuit monitor will power up using the either the rectified radiated rf energy from the receiver RX 310 or induced power line energy from coil 340 stored on the super capacitor of the charge pump 320. If the faulted circuit monitor 2 receives a valid code key from the exciter 3 then the faulted circuit monitor 2 waits for data commands from the exciter 3.

Under normal operating conditions of the faulted circuit monitoring device 2, the induced potential from the power line 1 into the coil 340 would power the charge pump 230 and super capacitor power supply circuit, directly. When no power is available from the power lines, rectified radiated rf energy into RX 310 remotely supplied from the exciter 3 would provide DC voltage to the charge pump 230 to power the device.

A battery 330 may also be used to provide power to the faulted circuit monitor device, however, the operational lifetime of the battery can be short and would be less than optimal except as a diagnostic device in a temporary deployment where after each temporary deployment the batteries would be replaced.

If the comparison of the ADC 240 data from the present readings was larger than a previously stored reading in memory 210, the control ASIC 200 would store the new value in memory 210. Additionally if the present current transducer 260 value is larger than the maximum level pre-programmed in memory 210, then a fault condition would be assumed.

This detection of a fault condition by the control ASIC 200, would trigger the ASIC to turn on and blink the LED 250. LED 250 provides an on-the-ground observer an indication a fault had taken place.

Again referring to FIG. 2, if the code key transmitted from the exciter 3 matches the code key stored in the ASIC 200 of the faulted circuit monitor, then the faulted circuit monitor will respond by transmitting 300 data stored in the memory 210 by the control ASIC 200. The Analog to Digital Converter, ADC, 240 performs the conversion of analog information from the current 260, voltage 290, strain 280, and temperature 270 transducers of the faulted circuit monitor.

If the code key transmitted by the exciter 3 does not match the internal code key in the faulted circuit monitor memory 210, the faulted circuit monitor will go into a power saving sleep mode of operation.

Software contained in the memory 210 permits the programming of the control ASIC 200. The control ASIC 200 can thus be of the nature of a micro-computer chip. A real time clock 230 is implemented either as a software program or a collection of circuitry that allows the association of date and time information with data stored as a normal mode of operation of the monitoring device, or after exceeding a pre-programmed maximum parametric value of the power line characteristic such as fault current above normal operational power line current as stored in memory 210.

Referring to FIGS. 2 and 3, the exciter 3 unit has a transmitting and receiving antenna 5 to transmit the rf energy 100 of a specific frequency to the remotely located faulted circuit monitor 2 through antenna 10. When the exciter 3 unit is brought in proximity to the faulted circuit monitor 2, the operator initiates a signal transmission from the exciter 3. If the code keys match, data collected by ADC 240 will be directed by ASIC 200 for RF transmission using a particular modulation scheme by rf transmitter 300 and antenna 10.

Design of the particular rf modulation scheme capable of encoding the data collected by the faulted circuit monitoring system 2 is well within the skill level of those ordinarily skilled in the art.

Once the data have been received at antenna 5 and demodulated by receiver 110 and by controller ASIC 120, the data are stored in the exciter memory 130. The data will be stored until downloaded thru I/O driver 140 to a host portable computer 4. A rechargeable battery 170 internal to the exciter 3 will power the exciter. A charge pump circuit 150 and coil 160 may be used to boost the battery voltage as needed to provide adequate time-of-use of the exciter 3 unit in the field application.

The specific frequency embodiment in the faulted circuit monitor 2 uses technology similar to that used in radio frequency identification (RFID) tags that use the rectified radiated rf energy as one of the internal power sources of the faulted circuit monitor device 2.

Figure 4:
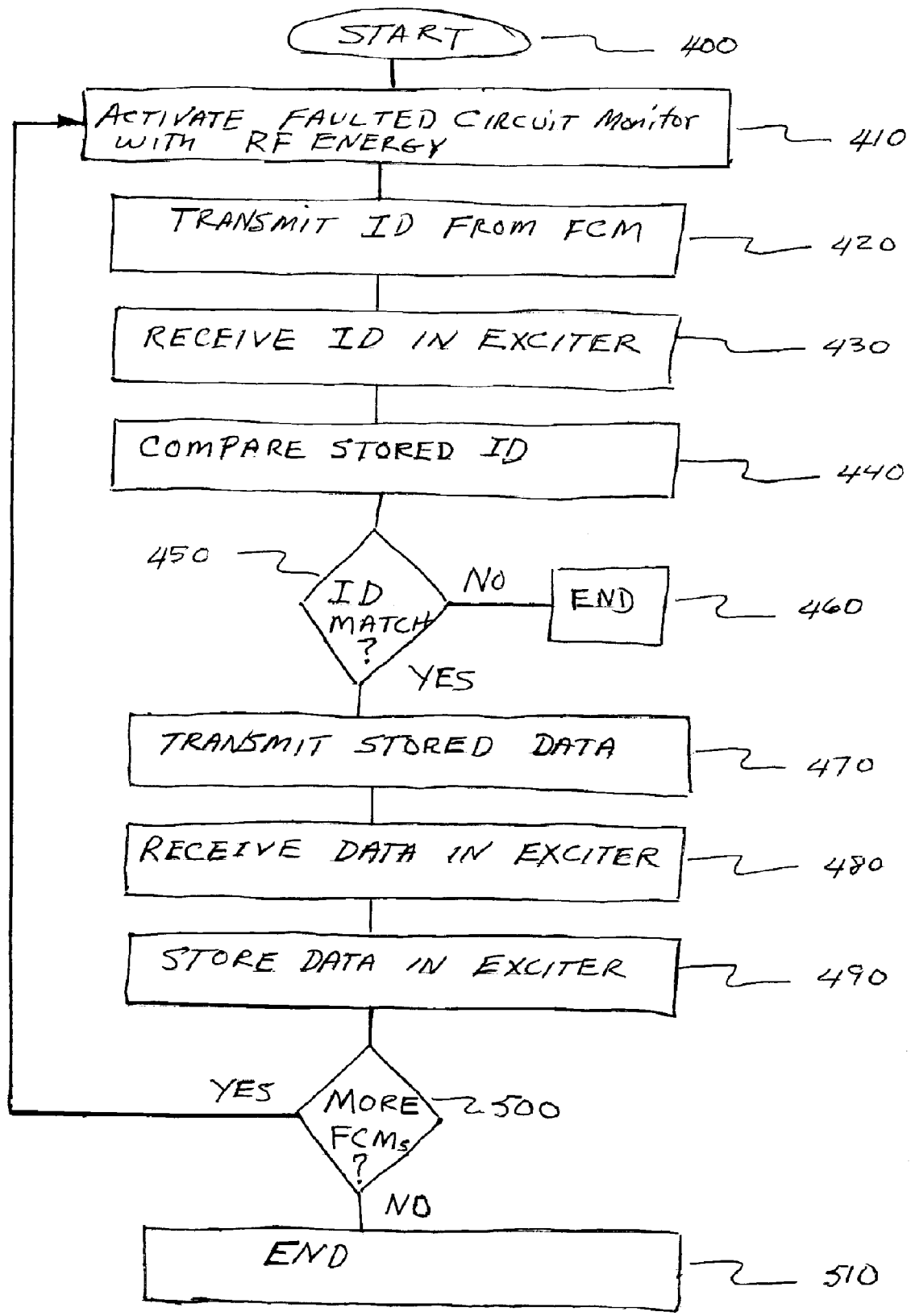
FIG. 4. is the flow diagram illustrating the operation of the remote faulted circuit monitoring system.

FIG. 4 is the flow diagram of the faulted circuit monitoring system 2 and the exciter 3 illustrating the method of operating the remote faulted circuit monitoring system. In the illustration of FIG. 4, the method begins at step 400. At step 410, the rf energy 6 is radiated from the exciter antenna 5 to the faulted circuit monitor antenna 10. The close proximity of the exciter thus radiates a specific rf frequency and is received by the faulted circuit monitor 3 where the receiver circuit 310 rectifies the received energy. The received energy is converted into a direct current sufficient for supplying power to the ASIC 200 and the transmitter, TX, 300. After the initial supply of power the ASIC compares a code key received to a code key stored in the ASIC 200. In step 420, after a successful comparison of the two sequences, the ASIC 200 activates. In step 420, the ASIC sends a particular series of ones and zeros to the transmitter 300. This sequence of ones and zeros comprises an RF modulation scheme to convey data to the exciter 3. The data comprises the "ID" of the faulted circuit monitor.

At step 430, the exciter receives the faulted circuit monitor "ID". The ID is unique for each faulted circuit monitor. In step 450, the exciter compares the "ID" of the faulted circuit monitor to the set of "ID's" stored in the exciter memory. Upon the successful comparison in step 470 results in a send data command to the faulted circuit monitor 2. If no matching ID's are received by the exciter 3; the program ends at step 460.

In step 470, the data are read from the memory 210 by the ASIC 200 and are transmitted to the exciter 3 as a series of rf pulses corresponding to a particular set of data that are stored in the memory 210.

At step 480, the transmitted series of rf pulses are received in the exciter 3 and de-modulated as a series of binary ones and zeros conveying the data from the memory 210. In step 490, received information is stored in the memory 130 of the exciter 3.

In step 500, the exciter 3 will attempt to activate more faulted circuit monitors by the method outlined in steps 410 through 450 using a different uniquely identified code key.

If a valid response is detected as in step 410, the method of acquiring the data information will continue as steps 420 to 490 depict. At step 500, the method will continue until no further valid code keys are received and no further data is stored in the memory 130 of the exciter 3. In step 510, the program terminates.

Data will be sent from the exciter 3 to the host PC 4 over a hard wired serial data link via the I/O 140 section of the exciter 3 in response to a host 4 command to send the stored data in the exciter memory 130.

Location, pole number, gps data or any number of enumeration and identification schemes used by the electric utility may be entered either electronically or manually into the host pc 4 for later use in determining the path of current flow based in the magnitude information conveyed from the faulted circuit monitor system. The collection of location data and faulted circuit data allow electric utilities to minimize the power outage time.

From the foregoing it can be seen that the present invention provides an improved method of a remote faulted circuit monitoring system and method.

While a particular embodiment of the present invention has been shown and described, modifications may be made. For example, batteries may be used in a device that provides a diagnostic tool for deployment along troublesome power lines having outage problems that heretofore were difficult to pinpoint in a large power system. Once the problems were diagnosed, the units would be collected for later use.

What is claimed is:

1. A method for determining a nominal and maximum current flow in an electric power line conductor under faulted circuit conditions, conductor temperature, conductor strain, and conductor line potential, the method comprising:
    (a) in a field environment, applying a specific frequency activation signal and code key from an exciter positioned proximate to the a faulted circuit monitoring apparatus located on the power line conductor;
    (b) activating said faulted circuit monitoring apparatus by way of said specific frequency activation signal and code key;
    (c) at the exciter, detecting a data signal from the faulted circuit monitoring apparatus, the data produced by modulating a specific frequency faulted circuit monitor in response to measured current, temperature, line potential and strain parameters;
    (d) at the exciter, receiving the parametric data from the data signal;
    (e) associating the faulted circuit current magnitude, temperature, strain and potential with the conductor phase information for the faulted circuit monitor apparatus;
    (f) repeating steps (a), (b), (c), (d) and (e) for all power line phase conductors on an electric power line;
    (g) and storing the parametric data and phase conductor information in the memory of the exciter for downloading to a host pc.

2. The method of claim 1 wherein applying a specific activation signal comprises applying an un-modulated signal having a specific frequency chosen to resonate with an rf detection circuit of the faulted circuit monitor.

3. The method of claim 2 wherein applying a specific frequency activation signal comprises applying a specific frequency or two distinct frequencies close to one another.

4. The method of claim 1 where in the fault current response time of the faulted circuit monitor is slowed to allow for "inrush" conditions on the power line.

5. The method of claim 4 wherein slowing the faulted circuit monitor to allow for "inrush" conditions on the electric power lines comprises sending a delay time value to the faulted circuit monitor from the exciter.

6. The method of claim 5 further comprising the step of the faulted circuit monitoring apparatus ignoring the current magnitude for a delay period of time after restoration of current power on the power line conductor, said time being set by a data signal sent from the exciter.

7. The method of claim 1 wherein applying a specific activation signal comprises positioning the exciter apparatus near the faulted circuit monitor to actuate the faulted circuit monitor with the specific frequency signal.

8. The method of claim 1 wherein a specific code key pattern of binary data are transmitted from the exciter by modulation of the rf signal.

9. The method of claim 1 wherein the faulted circuit monitor apparatus responds to only a match with the exciter transmitted code key.

10. The method of claim 1 wherein detecting a data signal from the faulted circuit monitor comprises:
    Detecting faulted circuit current magnitude, conductor temperature, conductor strain, and conductor potential information from the faulted circuit monitor data signal.

11. The method of claim 1 wherein detecting the data signal from the faulted circuit monitor comprises:
    Detecting an impedance modulation of a radiated rf field of the exciter; and decoding the data as the impedance modulation by operation of the faulted circuit monitor.

12. The method of claim 11 comprising sequentially associating detected identification information with respective power line conductor phases.

13. The method of claim 1 further comprising the step of downloading the faulted circuit monitor data and communicating the data over a hard wire link, a wireless link, or a network to a host pc.

14. The method of claim 13 wherein communicating data comprises:
    establishing a temporary connection between the exciter and the host pc;
    conveying the data from the exciter to the host pc over the temporary connection;
    and breaking the temporary connection.

15. The method of claim 1 wherein said faulted circuit monitoring apparatus is powered by said specific frequency activation signal.

* * * * *